US010775700B2

(12) United States Patent
Liao et al.

(10) Patent No.: US 10,775,700 B2
(45) Date of Patent: Sep. 15, 2020

(54) LITHOGRAPHY SYSTEM AND METHOD FOR EXPOSING WAFER

(71) Applicant: TAIWAN SEMICONDUCTOR MANUFACTURING CO., LTD., Hsinchu (TW)

(72) Inventors: Chi-Hung Liao, New Taipei (TW); Min-Cheng Wu, Taitung County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/449,184

(22) Filed: Jun. 21, 2019

(65) Prior Publication Data
US 2020/0057372 A1    Feb. 20, 2020

Related U.S. Application Data

(60) Provisional application No. 62/718,938, filed on Aug. 14, 2018.

(51) Int. Cl.
G03F 7/20        (2006.01)
G21K 1/06       (2006.01)
G02B 26/08     (2006.01)
H05G 2/00       (2006.01)

(52) U.S. Cl.
CPC ....... *G03F 7/2008* (2013.01); *G02B 26/0816* (2013.01); *G03F 7/2004* (2013.01); *G03F 7/70033* (2013.01); *G03F 7/70891* (2013.01); *G03F 7/70908* (2013.01); *G03F 7/70916* (2013.01); *G03F 7/70925* (2013.01); *G21K 1/06* (2013.01); *H05G 2/008* (2013.01)

(58) Field of Classification Search
CPC . G02B 26/0816; G03F 7/2004; G03F 7/2008; G03F 7/70033; G03F 7/70891; G03F 7/70908; G03F 7/70916; G03F 7/70925; G21K 1/06; H05G 2/008
USPC ......................................... 355/30, 67, 68, 77
See application file for complete search history.

(56) References Cited

U.S. PATENT DOCUMENTS

| 6,522,392 | B1* | 2/2003 | Muller-Rissmann ....................... G03F 7/70241 355/52 |
| 8,764,995 | B2 | 7/2014 | Chang et al. |
| 8,796,666 | B1 | 8/2014 | Huang et al. |
| 8,828,625 | B2 | 9/2014 | Lu et al. |
| 8,841,047 | B2 | 9/2014 | Yu et al. |
| 8,877,409 | B2 | 11/2014 | Hsu et al. |
| 9,093,530 | B2 | 7/2015 | Huang et al. |
| 9,184,054 | B1 | 11/2015 | Huang et al. |
| 9,256,123 | B2 | 2/2016 | Shih et al. |
| 9,529,268 | B2 | 12/2016 | Chang et al. |
| 9,548,303 | B2 | 1/2017 | Lee et al. |
| 2003/0189696 | A1* | 10/2003 | Sumiyoshi ............. G03B 27/54 355/67 |
| 2006/0001854 | A1* | 1/2006 | Singer ................ G02B 17/0657 355/67 |

(Continued)

*Primary Examiner* — Colin W Kreutzer
(74) *Attorney, Agent, or Firm* — Maschoff Brennan

(57) ABSTRACT

A method is provided. The method includes steps as follows. EUV light is generated. A collector is used to gather the EUV light onto a first optical reflector. The first optical reflector is used to reflect the EUV light to a reticle, so as to impart the EUV light with a pattern. A second optical reflector is used to reflect the EUV light with the pattern onto a wafer. The first optical reflector is rotated.

20 Claims, 17 Drawing Sheets

(56) References Cited

U.S. PATENT DOCUMENTS

| | | | |
|---|---|---|---|
| 2006/0039052 A1* | 2/2006 | Sano | G02B 7/00 |
| | | | 359/196.1 |
| 2009/0073412 A1* | 3/2009 | Pazidis | G03F 7/70308 |
| | | | 355/67 |
| 2011/0007292 A1* | 1/2011 | Van Herpen | G03F 7/70033 |
| | | | 355/67 |
| 2015/0085264 A1* | 3/2015 | Chien | G03F 7/2008 |
| | | | 355/30 |
| 2019/0384183 A1* | 12/2019 | Yang | G03F 7/70825 |

* cited by examiner

LITHOGRAPHY SYSTEM AND METHOD FOR EXPOSING WAFER

PRIORITY CLAIM AND CROSS-REFERENCE

This application claims priority to U.S. Provisional Application Ser. No. 62/718,938, filed Aug. 14, 2018, which is herein incorporated by reference.

BACKGROUND

Manufacturing of an integrated circuit (IC) has been driven by increasing the density of the IC formed in a semiconductor device. This is accomplished by implementing more aggressive design rules to allow a larger density of the IC device to be formed. Nonetheless, the increased density of IC devices, such as transistors, has also increased the complexity of processing semiconductor devices with decreased feature sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may b e arbitrarily increased or reduced for clarity of discussion.

DETAILED DESCRIPTION

Figure 1:
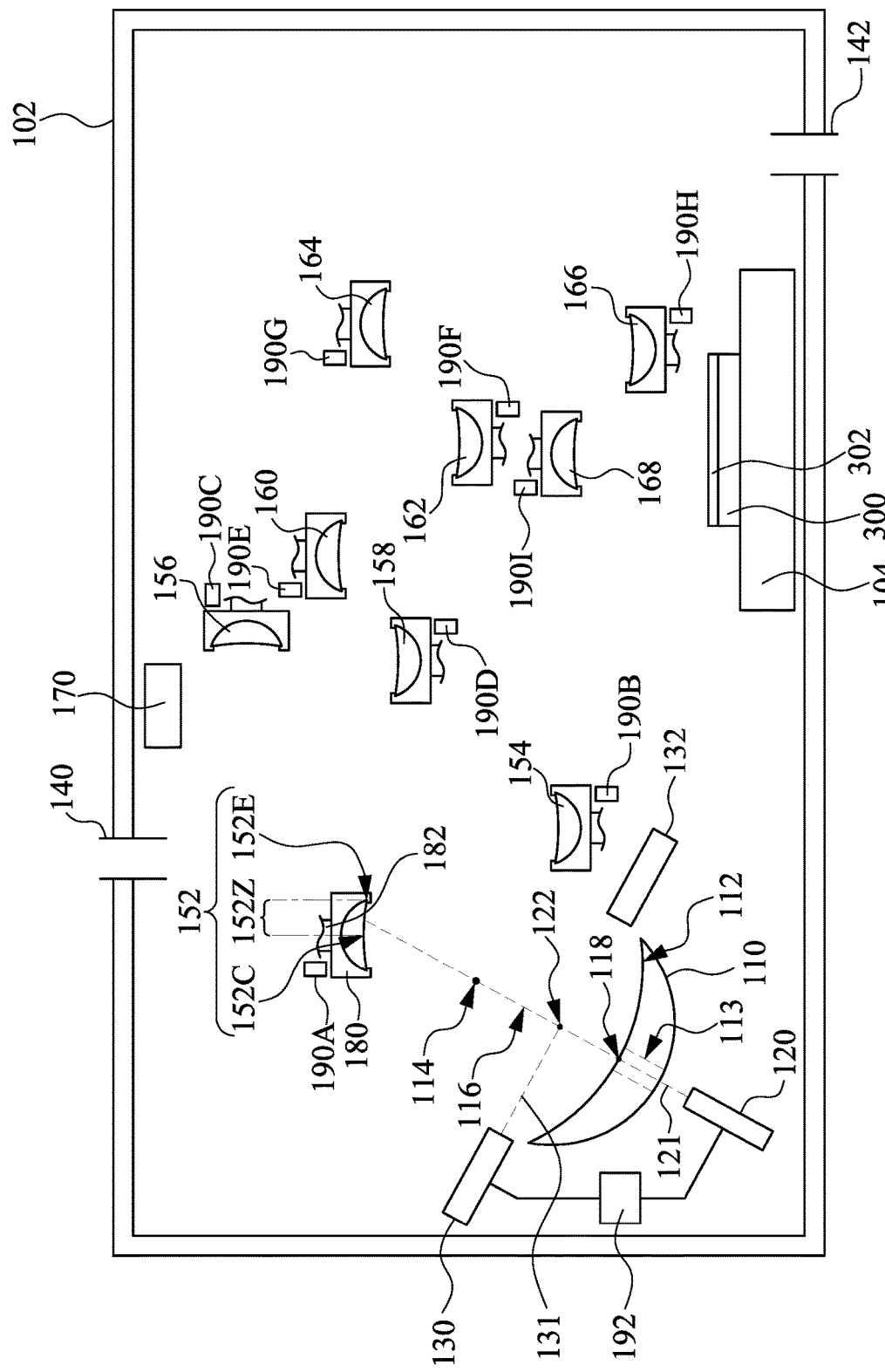
FIG. 1 illustrates a lithography system according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIG. 1 illustrates a lithography system 100 according to some embodiments of the present disclosure. The lithography system 100 includes a chamber 102, a collector 110, a laser generator 120, a droplet generator 130, a droplet catcher 132, an inlet port 140, an outlet port 142, optical reflectors 152, 154, 156, 158, 160, 162, 164, 166, 168, a reticle 170, a plurality of holders 180, a plurality of shafts 182, and controllers 190, 192. The lithography system 100 is an extreme ultraviolet (EUV) exposure tool that can perform an exposure operation for exposing a photoresist layer 302 coated on a wafer 300 within the chamber 102. For example, the lithography system 100 may include a stepper 104 disposed within the chamber 102, and the wafer 300 on which the photoresist layer 302 is coated is mounted on the stepper 104. The stepper 104 is movable in the chamber 102 and is configured to shift the wafer 300, such that the wafer 300 can be shifted at a suitable position for the exposing.

The collector 110 is disposed within the chamber 102. In some embodiments, the collector 110 is mounted to a support (not shown in FIG. 1) that is a part of the lithography system 100. The collector 110 has a concave mirror surface 112. The concave mirror surface 112 of collector 110 may have a focal point 114 and an axis of symmetry 116 which can serve as an optical axis of the collector 110. In greater detail, the axis of symmetry 116 of the collector 110 connects a center 118 of the mirror surface 112 and the focal point 114.

In some embodiments, the mirror surface 112 of the collector 110 can also be a multilayer reflector of any suitable structure and composition. The mirror surface 112 can include a distributed Bragg reflector formed from alternating layers of a high index of refraction material and a low index of refraction material. For example, the alternating layers can be Mo and Si or Mo and Be. In some embodiments, the mirror surface 112 includes more than 20 pairs of alternating layers. In some embodiments, the mirror surface 112 obtains a reflectivity greater than 60%. In some embodiments, the uppermost layer of the mirror surface 112 can be protected from oxidation by a capping layer, such as a layer of Ru. In some embodiments, the mirror surface 112 has an opening 113 through the center 118 of the mirror surface 112, and the opening 113 can be provided to allow passage of a light beam propagated from a back side of the collector 110.

The laser generator 120 is disposed within the chamber 102 and at the back side of the collector 110, and thus the mirror surface 112 of the collector 110 faces away from the laser generator 120. The laser generator 120 can be oriented such that the laser beam emitted from the laser generator 120 can go along the axis of symmetry 116 of the mirror surface 112. Stated differently, the laser generator 120 is oriented such that an optical path 121 of the laser generator 120 is the same as the axis of symmetry 116 of the mirror surface 112. The laser generator 120 is configured to generate a laser beam aiming at a target 122 in front of the mirror surface 112 of the collector 110. In some embodiments, the target 122 may be between the center 118 and the focal point 114 of the mirror surface 112. The laser generator 120 may emit a laser beam from the back side to a front side of the collector 110 through the opening 113 of the collector 110. In some embodiments, the laser generator 120 includes a laser source, such as a pulse carbon dioxide ($CO_2$) laser source.

The droplet generator 130 and the droplet catcher 132 are disposed within the chamber 102 and on two opposite sides of the collector 110 (e.g., a left side and a right side of the collector 110). The droplet generator 130 aims at the target 122 and thus shoots droplets along a droplet path 131 to the target 122. The droplet generator 130 is oriented such that the droplet path 131 intersects the axis of symmetry 116 of the mirror surface 112 at the target 122. Because the optical path 121 of the laser generator 120 is the same as the axis of symmetry 116 of the mirror surface 112, the droplet path 131 intersects the optical path 121 of the laser generator 120 as well. The droplet catcher 132 is configured to catch the droplets from the droplet generator 130. In some embodiments, example materials shot from the droplet generator 130 may include tin or other suitable material that can be used to generate EUV. In some embodiments, the pulses of the laser beam provided by the laser generator 120 and the droplet generating rate of the droplet generator 130 are controlled to be synchronized such that the droplets receive peak powers consistently from the laser pulses of the laser beam. In some embodiments, the laser generator 120 and the droplet generator 130 can be collectively operated to generate EUV light, and therefore the laser generator 120 in combination with the droplet generator 130 can serve as an EUV light source.

The inlet port 140 and the outlet port 142 pass sidewalls of the chamber 102 and are coupled to the inside of the chamber 102. In some embodiments, the inlet port 140 and the outlet port 142 are configured to provide a gas flow through the chamber 102 during the operation of the lithography system 100, so as to protect the collector 110 from contaminations, such as tin particles (e.g., tin debris).

The optical reflectors 152, 154, 156, 158, 160, 162, 164, 166, 168 are within the chamber 102. The optical reflectors 152, 154, 156 are optically coupled between the collector 110 and the reticle 170, and the optical reflectors 158, 160, 162, 164, 166, and 168 are optically coupled between the reticle 170 and the photoresist layer 302 on the wafer 300. The optical reflector 152 is optically coupled to the collector 110, and thus the mirror surface 112 of the collector 110 can reflect a light beam to the optical reflector 152. Afterward, the light beam can be reflected from the optical reflector 152 to the reticle 170 through reflection by the optical reflectors 154, 156. The optical reflector 158 is optically coupled to the reticle 170, and thus the light beam can be reflected from the reticle 170 to the optical reflector 158. Thereafter, the light beam can be reflected from the optical reflector 158 to the photoresist layer 302 through reflection by the optical reflectors 160, 162, 164, 166, and 168.

In some embodiments, the optical reflectors 152, 154, 156, 158, 160, 162, 164, 166, 168 are mirrors which respectively have reflection surfaces. In some embodiments, the optical reflectors 152, 154, 156, 158 can be multilayer structures that operate as distributed Braggs reflectors. The thickness of the layers can be optimized for each of the optical reflectors 152, 154, 156, 158 with respect to wavelength and angle of an incident light beam. In some embodiments, a first group of the optical reflectors 152, 154, 156, 158, 160, 162, 164, 166, 168 includes at least one concave mirror, and a second group of the optical reflectors 152, 154, 156, 158, 160, 162, 164, 166, 168 includes at least one convex mirror.

In some embodiments, a light beam propagated from the collector 110 to the optical reflectors 152, 154, 156, 158, 160, 162, 164, 166, 168 is an off-axis light beam with respect to the optical reflectors 152, 154, 156, 158, 160, 162, 164, 166, 168. For example, the optical reflector 152 has a center 152C, an annular edge 152E, and a non-central zone 152Z between the center 152C and the annular edge 152E, and the collector 110 and the optical reflector 152 are oriented such that a light beam reflected from the collector 110 can be incident on the non-central zone 152Z of the optical reflector 152. In this way, the light beam is offset from the center 152C and thus referred to as an off-axis light beam with respect to the optical reflector 152. In some embodiments, the axis of symmetry 116 of the collector 110 intersects the non-central zone 152Z, not the center 152C of the optical reflector 152, which in turn will be helpful for directing the light beam to the non-central zone 152Z.

In some embodiments, the optical reflectors 152, 154, 156, 158, 160, 162, 164, 166, 168 are respectively mounted to the holders 180 within the chamber 102, and the holders 180 are mounted to the corresponding shafts 182 within the chamber 102. In some embodiments, the holders 180 are rotatably mounted to the corresponding shafts 182, and such rotatable mounting can be any mounting system that connects the holders 180 and permits optical reflectors 152, 154, 156, 158, 160, 162, 164, 166, 168 to be rotated (i.e., revolved) without detaching it from its mounting.

Figure 2:
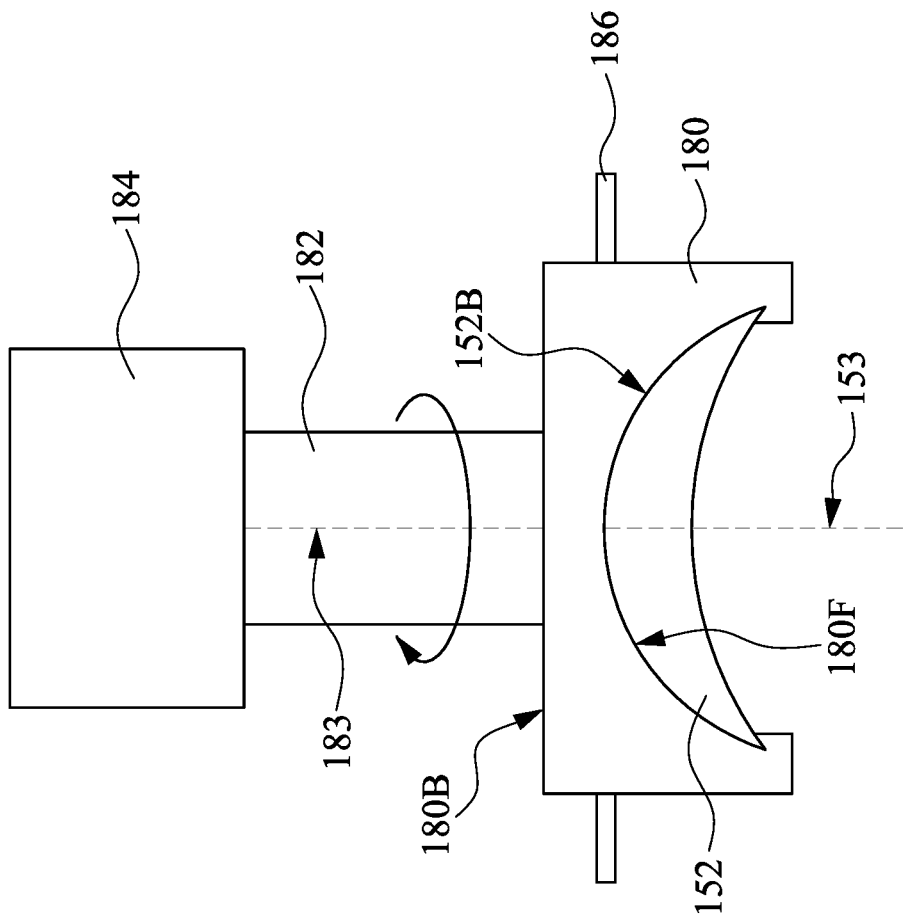
FIG. 2 which illustrates a side view of the optical reflector of FIG. 1.

For example, as shown in FIG. 2 which illustrates a side view of the optical reflector 152 of FIG. 1, the lithography system 100 further includes a motor 184 coupled to the shaft 182 and configured to drive the shaft 182 to rotate. In some embodiments, the motor 184 includes a micro electro mechanical system (MEMS) motor, a piezoelectric (PZT) motor, a DC (direct current) motor, or combinations thereof. In some embodiments, the optical reflector 152 is stably mounted to the holder 180, and the holder 180 is stably mounted to shaft 182. As such, the optical reflector 152 is mechanically connected to the motor 184. In this way, the optical reflector 152 can be rotated. For example, when the shaft 182 is driven by the motor 184 to rotate, the holder 180 and the optical reflector 152 are thus rotated. In some embodiments, the optical reflector 152 has an axis of symmetry 153 aligned with an axis of symmetry 183 of the shaft 182. In this way, when the shaft 182 is driven by the motor 184 to rotate about the axis of symmetry 183, the holder 180 and the optical reflector 152 thereon can rotate about the axis of symmetry 153.

The holder 180 has a front surface 180F facing the optical reflector 152 and a back surface 180B facing away from the optical reflector 152. In some embodiments, the front surface 180F of the holder 180 is concave and conformal to a back surface 152B of the optical reflector 152 facing the holder 180. In the example configuration in FIG. 2, the back surface 180B of the holder 180 is a substantially flat surface.

In other embodiments, the back surface 180B of the holder 180 is a curved surface. In some embodiments, the shaft 182 is fixed to the back surface 180B of the holder 180 to secure the holder 180.

Figure 3:
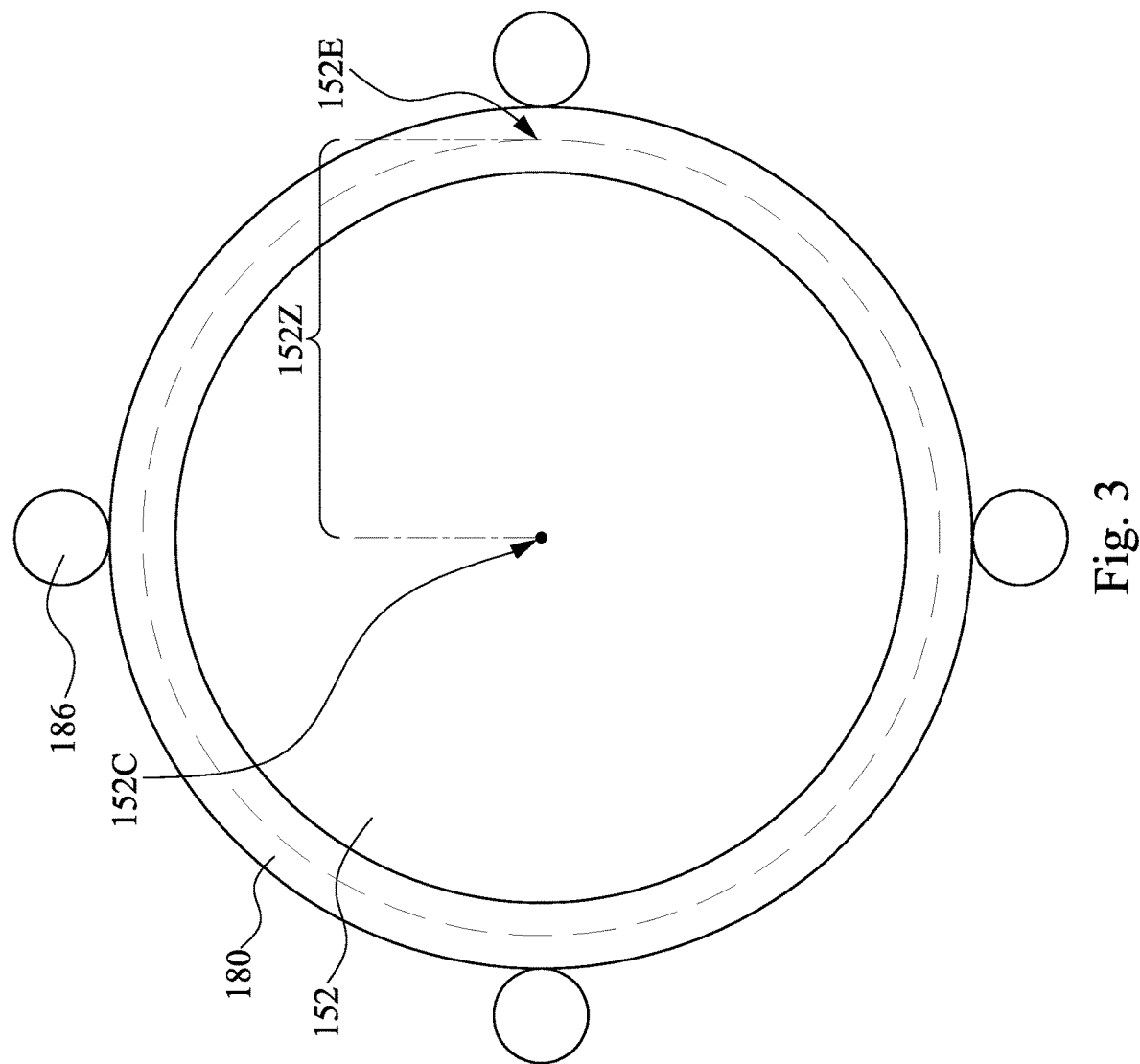
FIG. 3 illustrates a front view of the optical reflector of FIG. 1.

FIG. 3 illustrates a front view of the optical reflector 152 of FIG. 1. As shown in FIGS. 2 and 3, in some embodiments, the annular edge 152E of the optical reflector 152 is fixed to the holder 180. In some embodiments, the lithography system 100 further includes a plurality of rollers 186 to assist with the rotation of the optical reflector 152. The rollers 186 are arranged to be in contact with a perimeter of the holder 180. Such arrangement can be referred to as a perimeter mounting, which in turn will be advantageous for high positional stability.

Reference is made back to FIG. 1. The reticle 170 can be used to impart the light beam with a pattern so as to create a pattern in the photoresist layer 302 and thus the wafer 300. It is noted that the pattern imparted to the light beam may not exactly correspond to the desired pattern in the wafer, for example if the pattern includes phase-shifting features. Generally, the pattern imparted to the light beam will correspond to a particular functional layer in a device being created in the wafer, such as an integrated circuit. In some embodiments, the reticle 170 may include a distributed Bragg reflector. In some embodiments, the reticle 170 may include phase shifting layers and/or absorber layers to define the pattern. In some embodiments, the reticle 170 is an absorber-less phase-shifting mask.

The controllers 190A, 190B, 190C, 190D, 190E, 190F, 190G, 190H, 190I (collectively, the controller 190) are respectively electrically connected to the motors (e.g., the motor 184 of FIG. 2) which are configured to rotate the respective optical reflectors 152, 154, 156, 158, 160, 162, 164, 166, 168. In some embodiments, the controllers 190A-190I can be configured to determine whether to drive the rotation of the corresponding optical reflector (e.g., the optical reflector 152, 154, 156, 158, 160, 162, 164, 166, or 168). In some embodiments, the controller 192 is electrically connected to the laser generator 120 and the droplet generator 130 and is configured to trigger the laser emission operation of the laser generator 120 and the droplet shooting operation of the droplet generator 130.

In some embodiments, the controllers 190A-190I and 192 can be programmed such that the controllers 190A-190I can trigger rotations of the corresponding optical reflector (e.g., the optical reflector 152, 154, 156, 158, 160, 162, 164, 166, or 168) before the controller 192 triggers the laser emission operation and the droplet shooting operation. In some embodiments, the controllers 190A-190I and 192 can be programmed such that the controllers 190A-190I can trigger rotations of the corresponding optical reflector (e.g., the optical reflector 152, 154, 156, 158, 160, 162, 164, 166, or 168) after the controller 192 triggers the laser emission operation and the droplet shooting operation. In some embodiments, the controllers 190A-190I and 192 can be programmed such that the controllers 190A-190I can trigger rotations of the corresponding optical reflector (e.g., the optical reflector 152, 154, 156, 158, 160, 162, 164, 166, or 168) before the controller 192 halts the laser emission operation and the droplet shooting operation. In some embodiments, the controllers 190A-190I and 192 can be programmed such that the controllers 190A-190I can trigger rotations of the corresponding optical reflector (e.g., the optical reflector 152, 154, 156, 158, 160, 162, 164, 166, or 168) after the controller 192 halts the laser emission operation and the droplet shooting operation.

In some embodiments, the controllers 190A-190I and 192 can be programmed such that the controllers 190A-190I can halt rotations of the corresponding optical reflector (e.g., the optical reflector 152, 154, 156, 158, 160, 162, 164, 166, or 168) before the controller 192 halts the laser emission operation and the droplet shooting operation. In some embodiments, the controllers 190A-190I and 192 can be programmed such that the controllers 190A-190I can halt rotations of the corresponding optical reflector (e.g., the optical reflector 152, 154, 156, 158, 160, 162, 164, 166, or 168) after the controller 192 halts the laser emission operation and the droplet shooting operation.

In some embodiments, the rotations, the laser emission operation, and the droplet shooting operation are controlled to be synchronized, and the controllers 190A-190I and 192 can be programmed such that the controllers 190A-190I can trigger rotations of the corresponding optical reflector (e.g., the optical reflector 152, 154, 156, 158, 160, 162, 164, 166, or 168) during the controller 192 triggers the laser emission operation and the droplet shooting operation. For example, the controllers 190A-190I and 192 can be programmed such that the controllers 190A-190I triggers rotations of the corresponding optical reflector (e.g., the optical reflector 152, 154, 156, 158, 160, 162, 164, 166, or 168) and the controller 192 triggers the laser emission operation and the droplet shooting operation at the same time.

In some embodiments, after halting the laser emission operation and the droplet shooting operation, the controller 192 can be programmed to resume the laser emission operation and the droplet shooting operation. In some embodiments, after halting the rotations of the corresponding optical reflector (e.g., the optical reflector 152, 154, 156, 158, 160, 162, 164, 166, or 168), the controllers 190A-190I can be programmed to resume the corresponding rotations.

Figure 4:
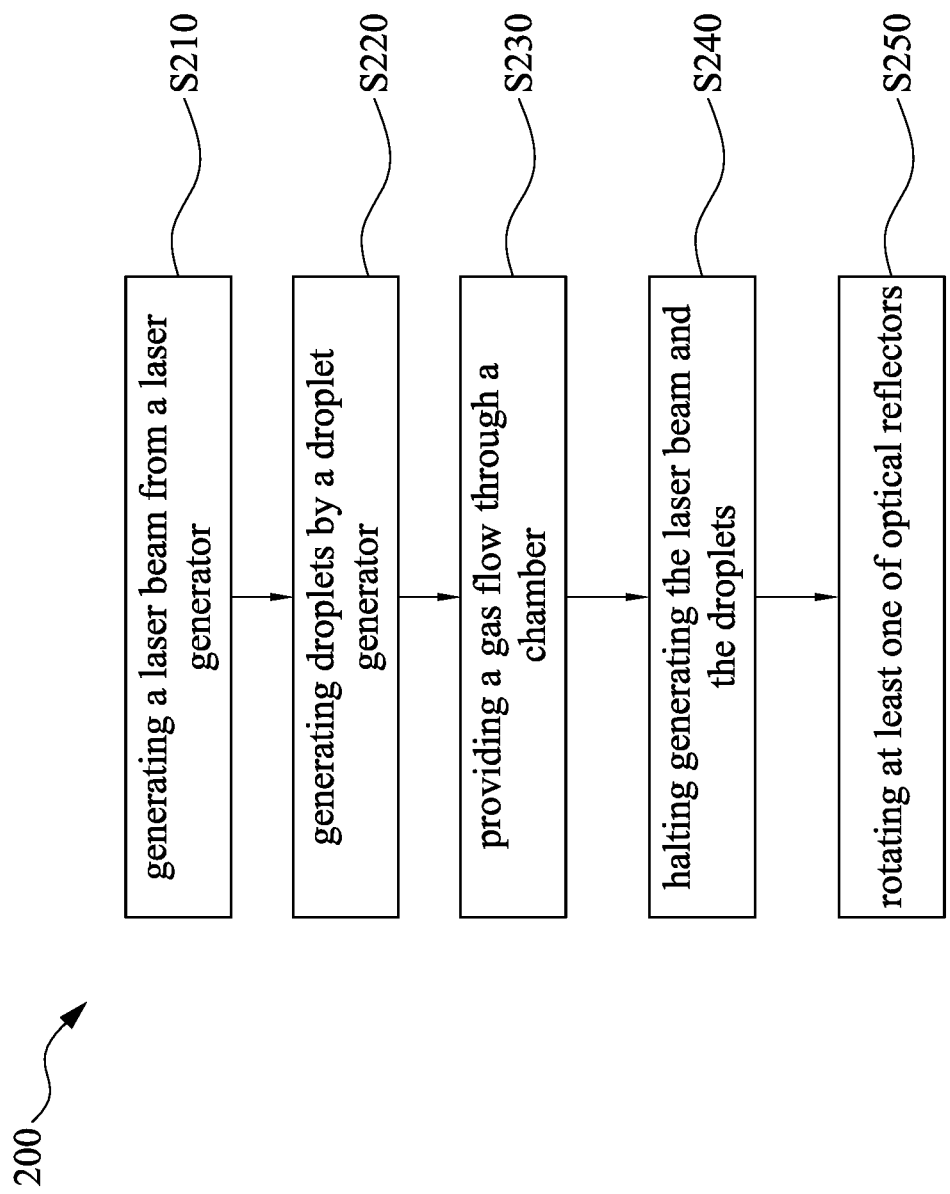
FIG. 4 is a flow chart of a process according to some embodiments of the present disclosure.
Figure 5:
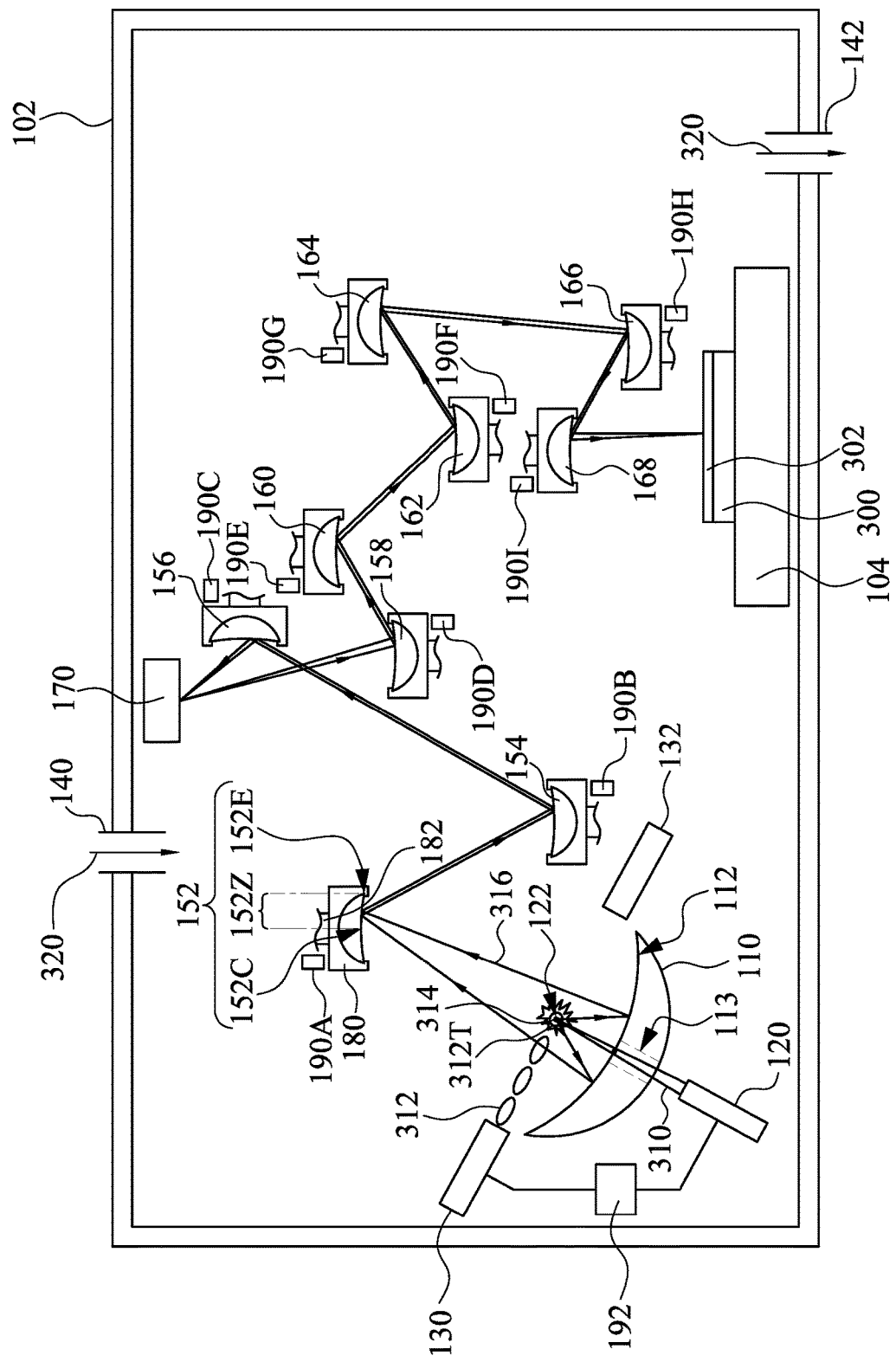
FIGS. 5-9 illustrate the lithography system of FIG. 1 with which the process of FIG. 4 is implemented at various stages according to some embodiments of the present disclosure.

FIG. 4 is a flow chart of a process 200 according to some embodiments of the present disclosure. FIGS. 5-9 illustrate the lithography system 100 of FIG. 1 with which the process 200 of FIG. 4 is implemented at various stages according to some embodiments of the present disclosure. The process 200 includes actions S210, S220, S230, S240, and S250. The lithography system 100 can be operated to expose a photoresist layer coated on a wafer by the process 200. For example, as shown in FIG. 5, the wafer 300 on which the photoresist layer 302 is coated is mounted on the stepper 104 within the chamber 102, and the lithography system 100 is operated to expose the photoresist layer 302 coated on the wafer 300.

The action S210 is generating a laser beam from a laser generator. For example, as shown in FIG. 5, the controller 192 can be programmed to trigger a laser emission operation such that the laser generator 120 can generate a laser beam 310. As previously described, the laser generator 120 can be oriented such that the laser beam 310 emitted from the laser generator 120 can go along the axis of symmetry 116 of the mirror surface 112, and the laser generator 120 is configured to generate the laser beam 310 aiming at the target 122 in front of the mirror surface 112 of the collector 110. As such, the laser beam 310 can be sent to the target 122 in the axis of symmetry 116 of the mirror surface 112.

The action S220 is generating droplets by a droplet generator. For example, as shown in FIG. 5, the controller 192 can be programmed to trigger a droplet shooting operation such that droplets 312 are generated by the droplet generator 130. In some embodiments, the droplets 312 may include tin or other suitable materials that can be used to generate EUV. In some embodiments, the droplets 312 from the droplet generator 130 may be caught by the droplet catcher 132. Since the droplet generator 130 aims at the target 122, the droplets 312 can be directed to the target 122 by the droplet generator 130 such that the laser beam 310 is incident on a droplet 312T.

Thereafter, the droplet 312T can be irradiated by the laser beam 310, so as to produce high-temperature plasma 314 by heating the droplet 312T. In some embodiments, the high-temperature plasma 314 may be referred to as a microplasma which can generate EUV light 316. In some embodiments, the lithography system 100 produces EUV light 316 with a wavelength in the range from 3 nm to 15 nm, for example a wavelength of about 13.5 nm. A generator for droplets other than tin can be used in place of the droplet generator 130 and another wavelength laser can replace the laser generator 120, and the microplasma can be formed in any suitable manner. In some embodiments, the controller 192 can be programmed to trigger the laser emission operation and the droplet shooting operation, and the EUV light 316 is generated in response to the laser emission operation and the droplet shooting operation.

The EUV light 316 is reflected by the mirror surface 112 of the collector 110 toward the optical reflector 152. In some embodiments, the EUV light 316 is widely scattered to produce the reflected EUV light. The collector 110 can gather the EUV light 316 and direct the EUV light 316 onto the optical reflector 152. The EUV light 316 then can be reflected by the optical reflectors 152, 154, 156 in sequence and to the reticle 170 as illustrated in FIG. 5. The reticle 170 reflects the EUV light 316, which in turn imparts the EUV light 316 with a pattern.

Figure 6:
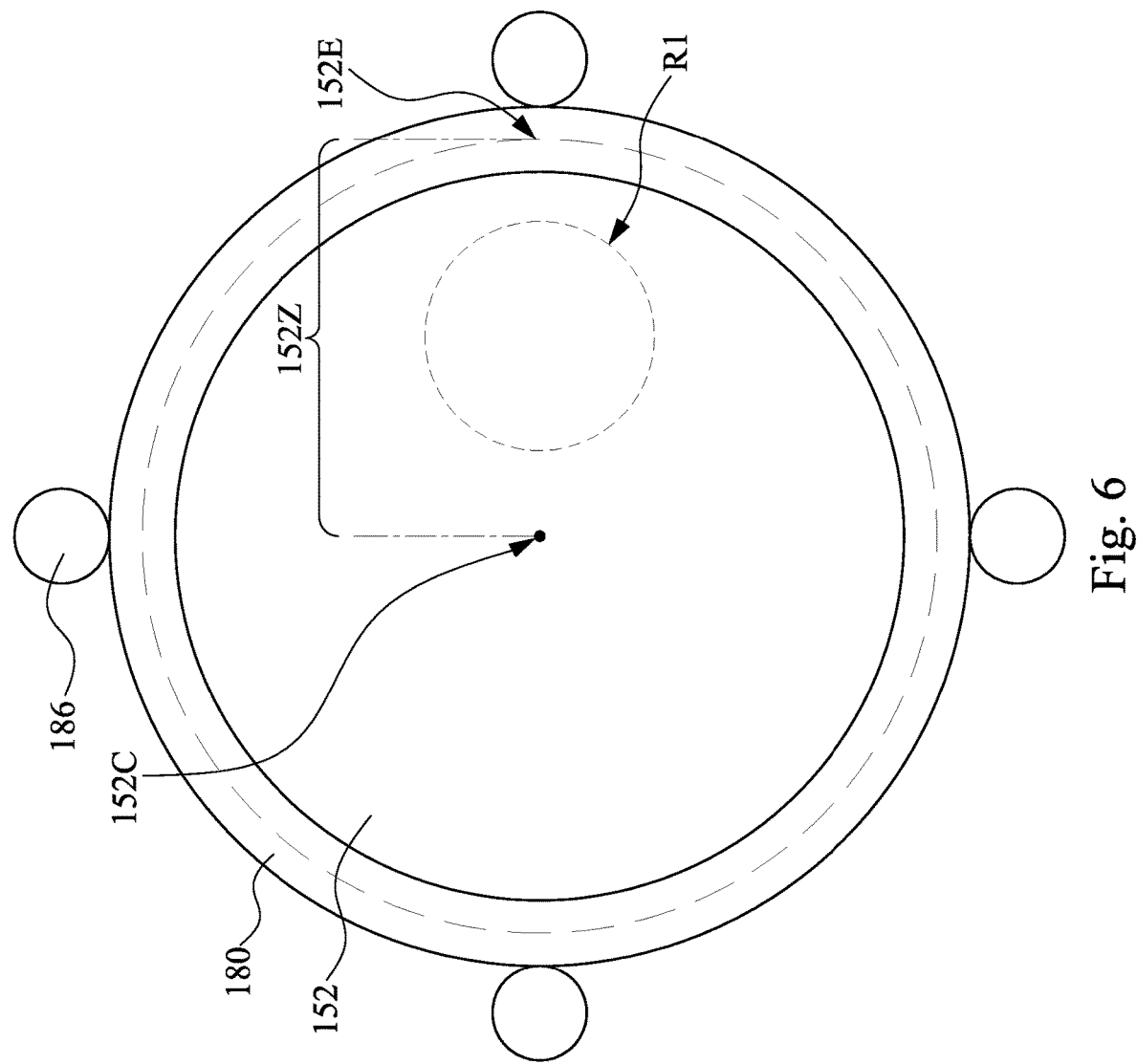

Reference is made to FIGS. 5 and 6, in which FIG. 6 is a front view of the optical reflector 152 of FIG. 5. The collector 110 and the optical reflector 152 are oriented such that the EUV light 316 reflected from the collector 110 can be incident on the non-central zone 152Z of the optical reflector 152. For example, the EUV light 316 may illuminate onto a first region R1 within the non-central zone 152Z of the optical reflector 152, as shown in FIG. 6. Accordingly, the light beam 310 is offset from the center 152C and thus referred to as an off-axis EUV light beam with respect to the optical reflector 152.

After using the optical reflectors 152, 154, 156 to reflect the EUV light 316 to the reticle 170, a pattern is imparted to the EUV light 316. Thereafter, the EUV light 316 imparted with the pattern is directed to the photoresist 302 coated on the wafer 300 by the optical reflectors 158, 160, 162, 164, 166, 168. Similarly, the EUV light 316 incident on the optical reflectors 154, 156, 158, 160, 162, 164, 166, 168 is an off-axis EUV light beam with respect to the corresponding optical reflectors 154, 156, 158, 160, 162, 164, 166, 168. The lithography system 100 thereby selectively exposes the photoresist 302 coated on the wafer 300 in a pattern defined by the reticle 170 (i.e., the pattern imparted to the EUV light 316).

The action S230 is providing a gas flow through a chamber. For example, as shown in FIG. 5, a gas flow 320 is provided to flow through the chamber 102. The gas flow 320 can enter the chamber 102 through the inlet port 140, and the gas flow 320 can leave the chamber 102 through outlet port 142. In some embodiments, the gas flow is provided to flow through the chamber 102 in which the collector 110 and other components of the lithography system 100 are enclosed.

Figure 7:
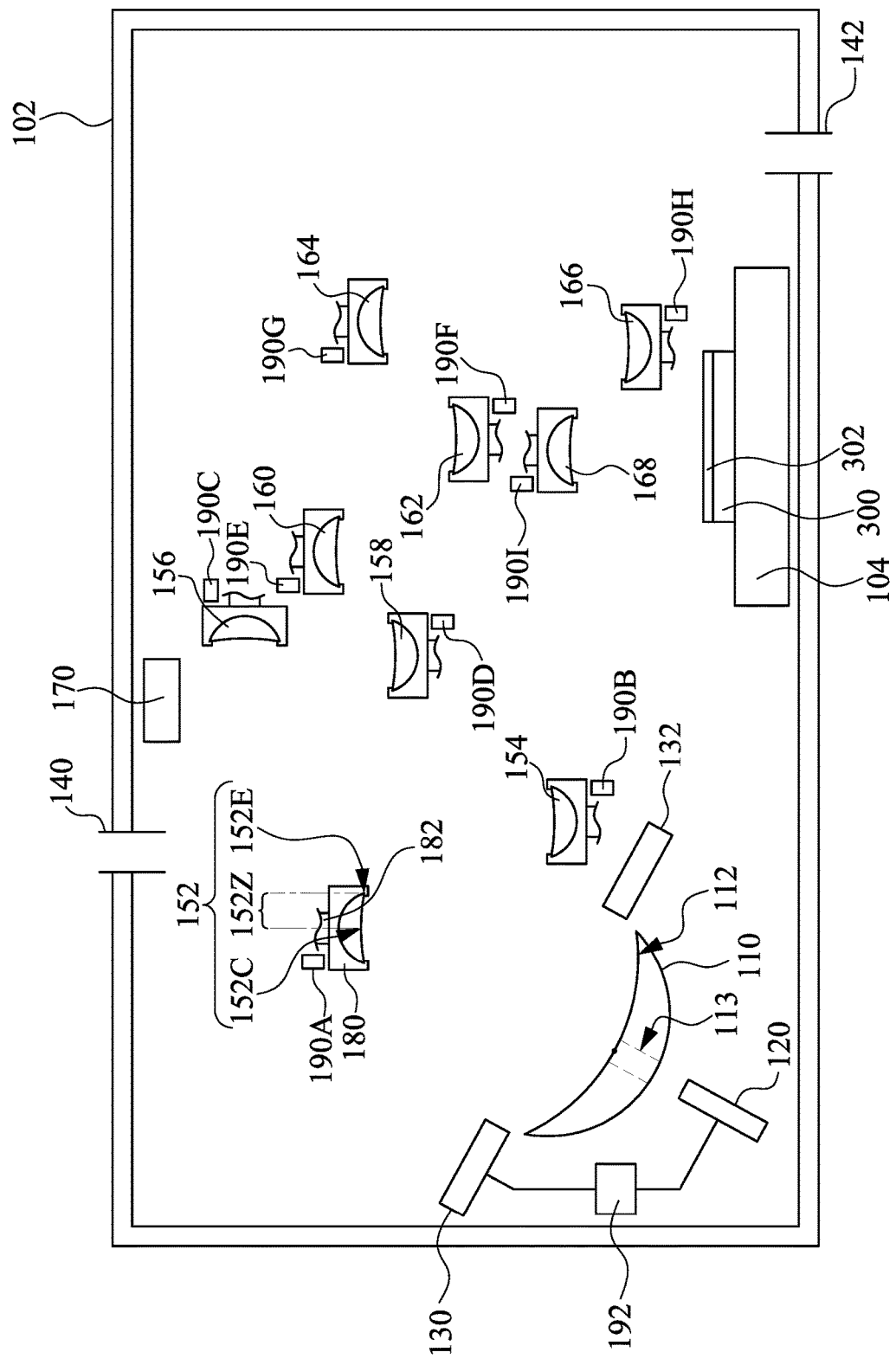

Following the actions S210, S220, and S230, the process 200 continues with the action S240 which is halting generating the laser beam and the droplets. For example, as shown in FIG. 7, the controller 192 can be programmed to halt the laser emission operation and the droplet shooting operation, and the generation of the EUV light is halted as well.

Figure 8:
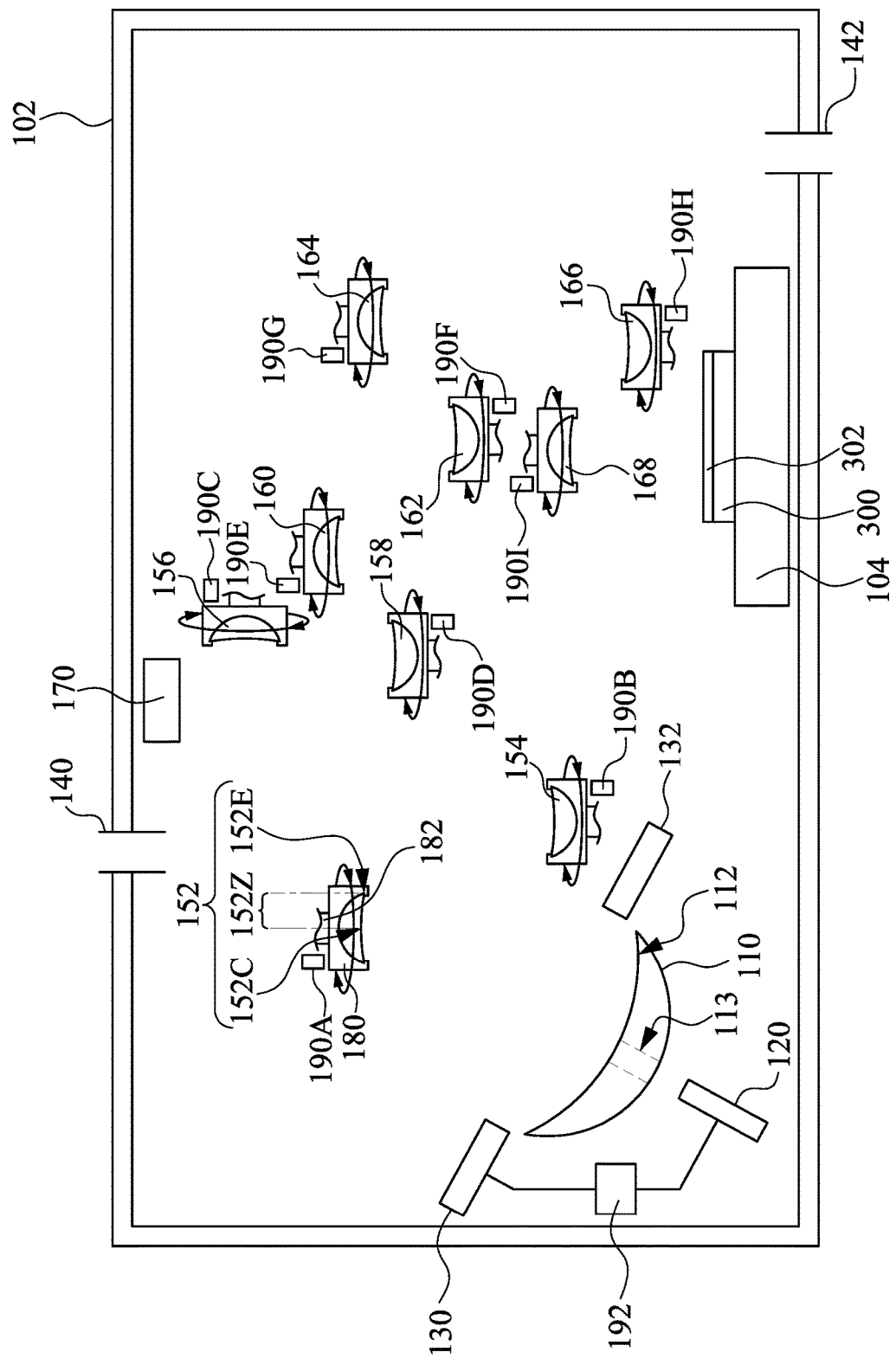
Figure 9:
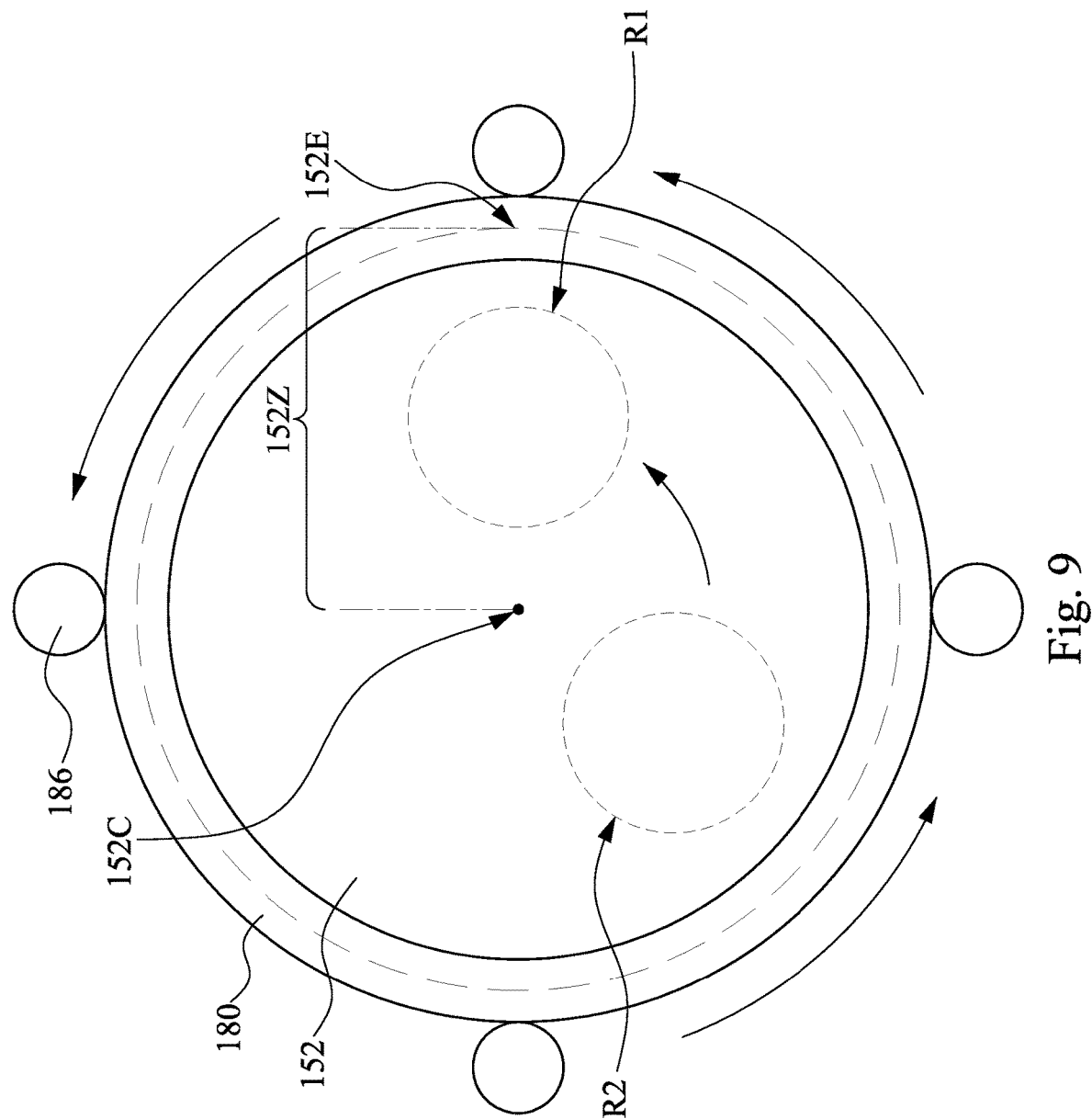

Thereafter, the process 200 continues with the action S250 which is rotating at least one of optical reflectors. For example, as shown in FIGS. 8 and 9, the controllers 190A-190I can be programmed to trigger rotations of the optical reflectors 152, 154, 156, 158, 160, 162, 164, 166, and 168 such that the optical reflectors 152, 154, 156, 158, 160, 162, 164, 166, and 168 are rotated. Stated differently, the controllers 190A-190I and 192 can be programmed such that the controllers 190A-190I can trigger the rotations of the optical reflectors 152, 154, 156, 158, 160, 162, 164, 166, or 168 after the controller 192 triggers and halts the laser emission operation and the droplet shooting operation.

In some embodiments, the optical reflectors 152, 154, 156, 158, 160, 162, 164, 166, or 168 are rotated by applying mechanical force provided by the motors (e.g., the motor 184 of FIG. 2) which are mechanically connected to the optical reflectors 152, 154, 156, 158, 160, 162, 164, 166, 168, respectively, through the corresponding shafts 182. In some embodiments, the optical reflectors 152, 154, 156, 158, 160, 162, 164, 166, 168 can be rotated about the centers thereof, and the rotated optical reflectors 152, 154, 156, 158, 160, 162, 164, 166, 168 are free from translation motion during the rotations. For example, the optical reflector 152 is rotated about the center 152C thereof. In some embodiments, the action S240 further includes rotating at least one of the optical reflectors 152, 154, 156, 158, 160, 162, 164, 166, 168 by a predetermined angle in a range from, for example, 1 degree to 359 degrees. In some embodiments, the predetermined angle is sufficient to make at least one of the optical reflectors 152, 154, 156, 158, 160, 162, 164, 166, 168 rotate such that a next to-be-illuminated region non-overlaps with an unilluminated region. In some embodiments, rotating at least one of the optical reflectors 152, 154, 156, 158, 160, 162, 164, 166, 168 by the predetermined angle can be achieved by the controllers 190A-190I. In some embodiments, the optical reflectors 152, 154, 156, 158, 160, 162, 164, 166, 168 are rotated by the same angle. In some embodiments, two of the optical reflectors 152, 154, 156, 158, 160, 162, 164, 166, 168 are rotated by different angles. In some embodiments, the optical reflectors 152, 154, 156, 158, 160, 162, 164, 166, 168 are rotated until the controllers 190A-190 halt the rotations of the corresponding optical reflectors 152, 154, 156, 158, 160, 162, 164, 166, 168.

By rotating the optical reflectors 152, 154, 156, 158, 160, 162, 164, 166, 168, the illuminated regions of the optical reflectors 152, 154, 156, 158, 160, 162, 164, 166, 168 are left from the original positions thereof, and the unilluminated regions of the optical reflectors 152, 154, 156, 158, 160, 162, 164, 166, 168 are rotated to positions the same as the original positions of the illuminated regions of the optical reflectors 152, 154, 156, 158, 160, 162, 164, 166, 168. For example, as shown in FIG. 9, with respect to the optical reflector 152, the first region R1 within the non-central zone 152Z is the illuminated region, and a second region R2 within the non-central zone 152Z is the unilluminated region. In some embodiments, the optical reflector 152 is rotated by less than one turn. By rotating the optical reflector 152, the first region R1 is left from the original position thereof, and the second region R2 is rotated to a position the same as the original position of the first region R1. The position of the first region R1 with respect to the chamber 102 prior to the rotation may be the same as the position of the second region R2 with respect to the chamber 102 after the rotation. As such, the second region R2 (i.e., a next to-be-illuminated region) can reflect EUV light instead of the first region R1 (i.e., an already-illuminated region). For example, after rotating the optical reflector 152, the unilluminated regions thereof (e.g., the second region R2) can be configured to reflect EUV light in a subsequent exposure process.

In this regard, during the laser emission operation and the droplet shooting operation, the EUV light (e.g., the EUV light 316 illustrated in FIG. 5) that is incident on the first region R1 would cause a decrease in the reflectivity of the first region R1 as time passes, and thus the second region R2 may therefore have the reflectivity higher than that of the first region R1 due to reduced EUV light exposure. By rotating the optical reflectors 152, 154, 156, 158, 160, 162, 164, 166, 168, EUV light can be reflected from these "unilluminated regions" of the optical reflectors 152, 154, 156, 158, 160, 162, 164, 166, 168 during a subsequent exposure process, which can be advantageous for avoiding energy loss of the EUV light which is applied to a photoresist layer.

In the example configuration in FIGS. 8 and 9, the controllers 190A-190I are programmed to trigger and halt the rotations of the optical reflectors 152, 154, 156, 158, 160, 162, 164, 166, 168 after triggering and halting the laser emission operation and the droplet shooting operation by the controller 192. In other embodiments, the controllers 190A-190I are programmed to trigger and halt the rotations of the optical reflectors 152, 154, 156, 158, 160, 162, 164, 166, 168 before triggering and halting the laser emission operation and the droplet shooting operation by the controller 192.

In the example configuration in FIGS. 8 and 9, the optical reflectors 152, 154, 156, 158, 160, 162, 164, 166, 168 are rotated. In other embodiments, a first group of the optical reflectors 152, 154, 156, 158, 160, 162, 164, 166, 168 is rotated, and a second group of the optical reflectors 152, 154, 156, 158, 160, 162, 164, 166, 168 is static (i.e., stationary). For example, when the rotation of the optical reflector 152 is triggered such that the optical reflector 152 rotates, the optical reflector 160 may be static.

Figure 10:
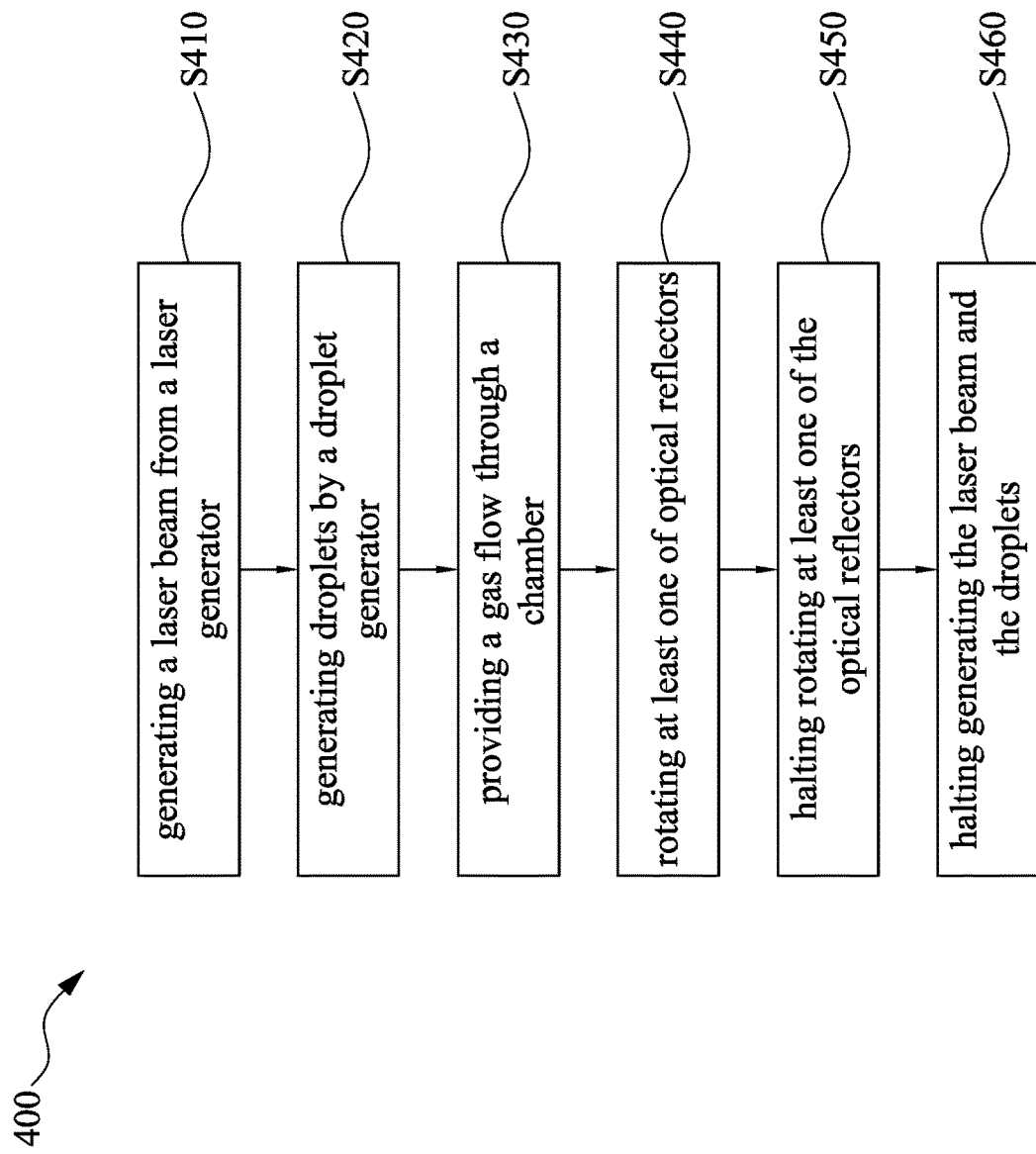
FIG. 10 is a flow chart of a process according to some embodiments of the present disclosure.
Figure 11:
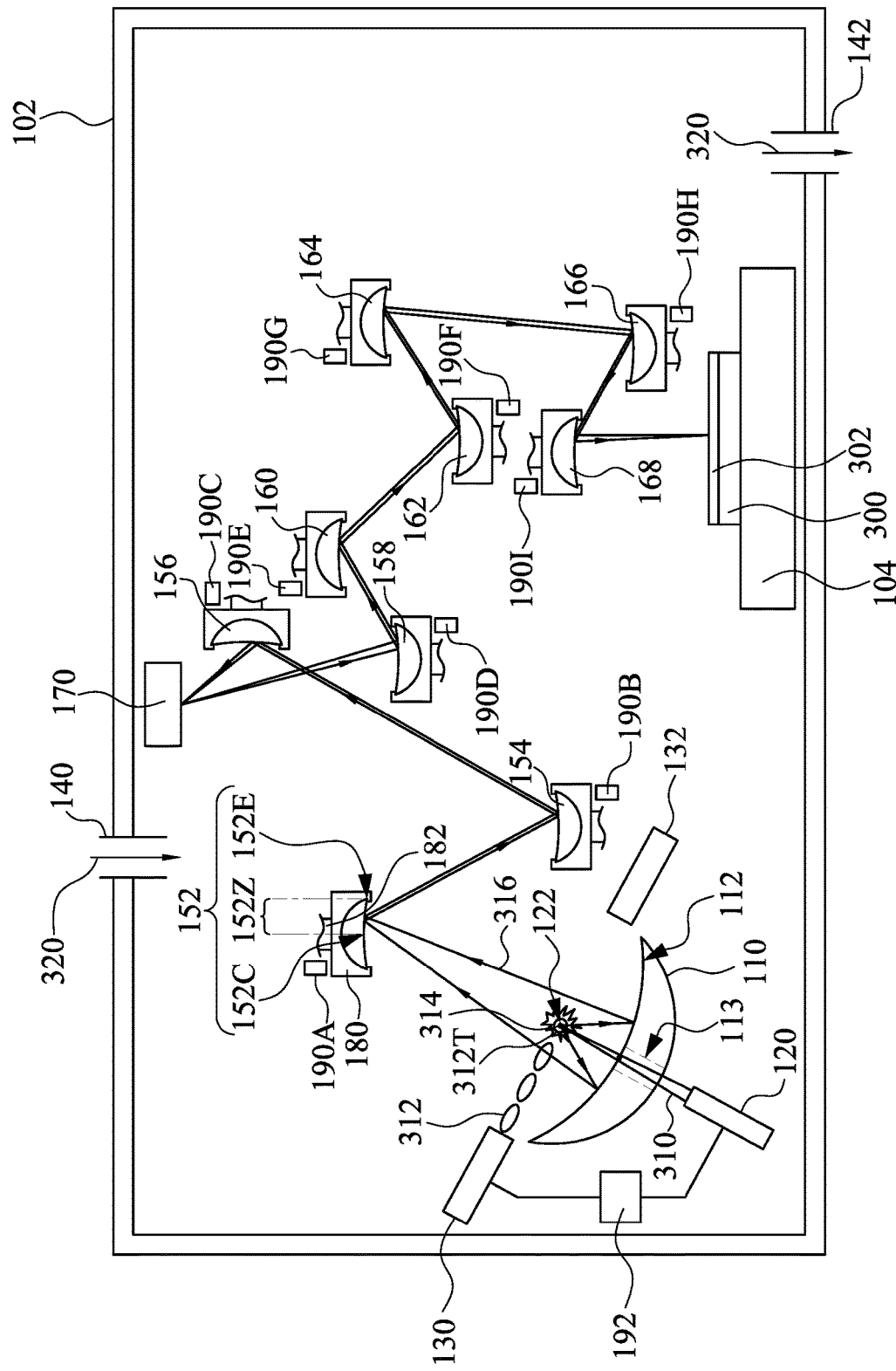
FIGS. 11-13 illustrate the lithography system of FIG. 1 with which the process of FIG. 10 is implemented according to some embodiments of the present disclosure.
Figure 12:
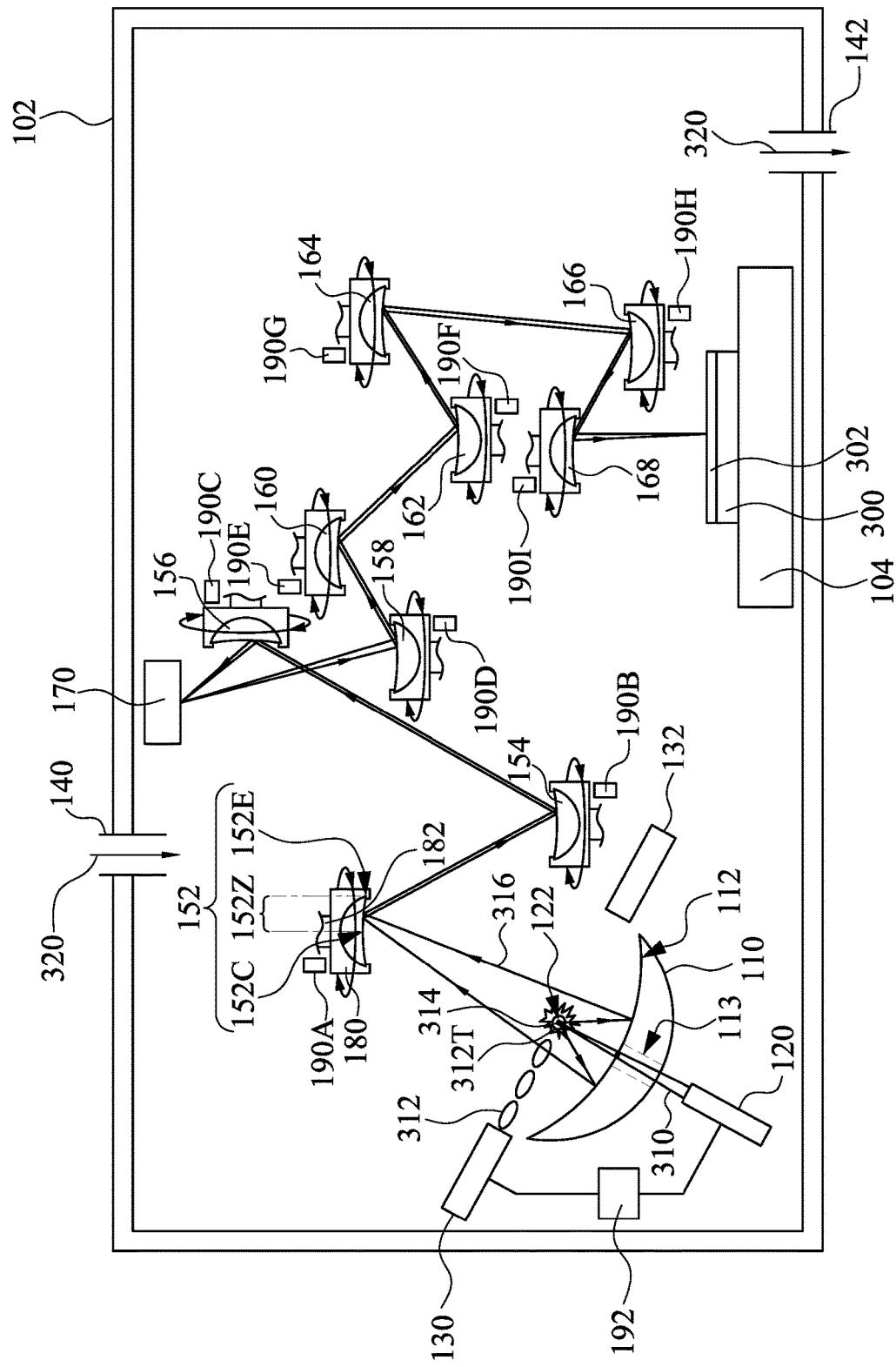
Figure 13:
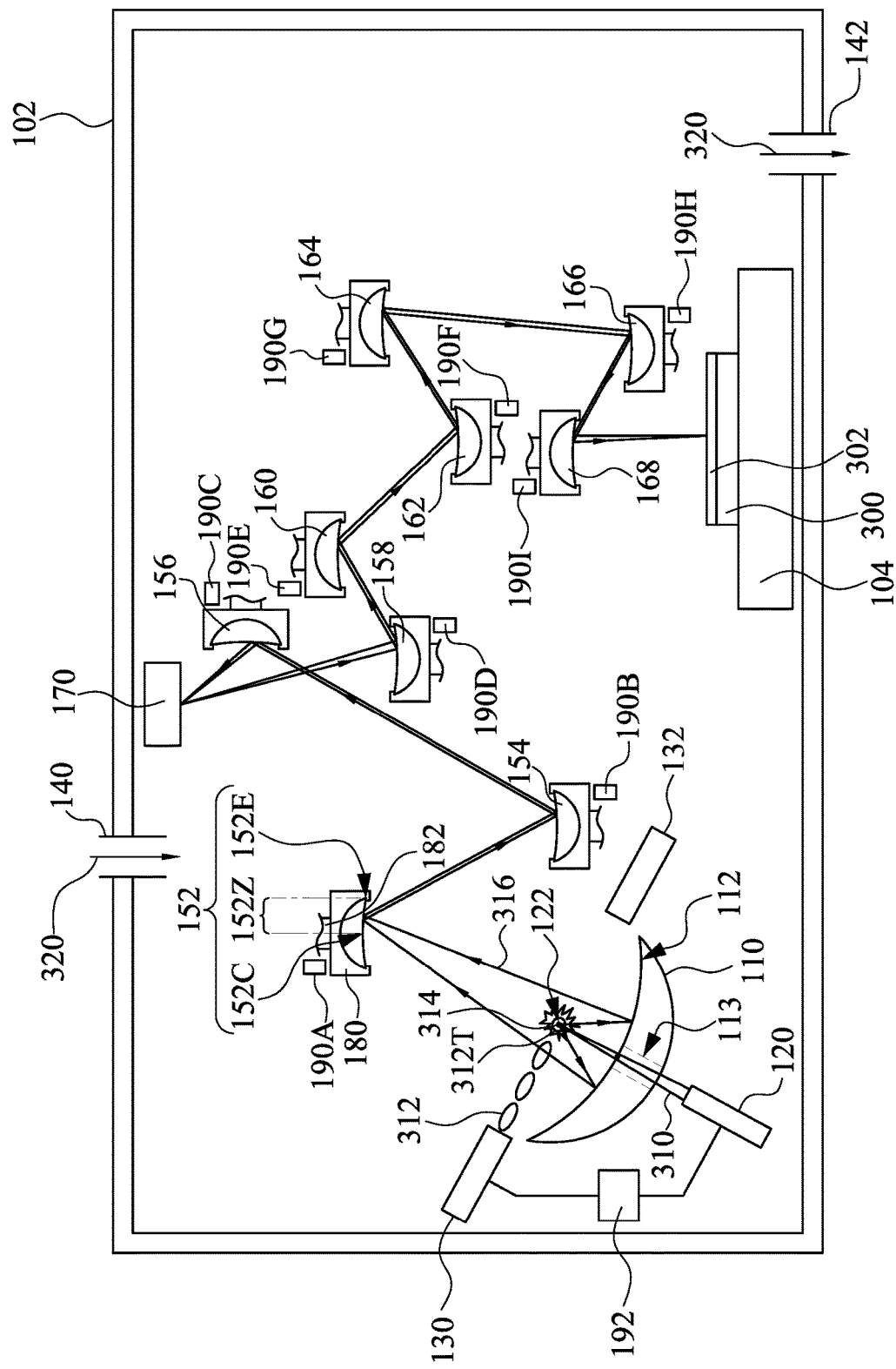

FIG. 10 is a flow chart of a process 400 according to some embodiments of the present disclosure. FIGS. 11-13 illustrate the lithography system 100 of FIG. 1 with which the process 400 of FIG. 10 is implemented according to some embodiments of the present disclosure. The process 400 includes actions S410, S420, S430, S440, S450, and S460. The lithography system 100 can be operated to expose a photoresist layer coated on a wafer by the process 400. For example, as shown in FIG. 11, the wafer 300 on which the photoresist layer 302 is coated is mounted on the stepper 104 within the chamber 102, and the lithography system 100 is operated to expose the photoresist layer 302 coated on the wafer 300.

Many aspects of the process 400 are the same as or similar to those of the process 200 as previously described in FIG. 4. For example, the action S410 is generating a laser beam from a laser generator, and many aspects of the action S410 are the same as or similar to those of the action S210 as previously described in FIG. 5. The action S420 is generating droplets by a droplet generator, and many aspects of the action S420 are the same as or similar to those of the action S220 as previously described in FIG. 5. The action S430 is providing a gas flow through a chamber, and many aspects of the action S430 are the same as or similar to those of the action S230 as previously described in FIG. 5. During the actions S410, S420, and S430, EUV light is generated as well. For example, as shown in FIG. 11, EUV light 316 is generated to expose the photoresist layer 302 coated on the wafer 300. Because the actions S410, S420, and S430 can be performed as previously described in FIG. 5, and the detailed explanation may be omitted.

Different from the process 200, in the process 400, triggering a rotation of at least one of optical reflectors is performed before halting the laser emission operation and the droplet shooting operation. Accordingly, following the actions S410, S420, and S430, the process 400 continues with the action S440 which is rotating at least one of optical reflectors. For example, as shown in FIG. 12, the controllers 190A-190I can be programmed to trigger rotations of the optical reflectors 152, 154, 156, 158, 160, 162, 164, 166, 168 while the EUV light 316 is generated, such that the optical reflectors 152, 154, 156, 158, 160, 162, 164, 166, 168 are rotated during the generation of the EUV light 316 (i.e., during the laser emission operation and the droplet shooting operation).

Thereafter, the process 400 continues with the actions S450 which is halting rotating at least one of the optical reflectors. For example, as shown in FIG. 13, before the controller 192 halts the laser emission operation and the droplet shooting operation, the controllers 190A-190I and 192 can be programmed such that the controllers 190A-190I can halt the rotations of the optical reflectors 152, 154, 156, 158, 160, 162, 164, 166, 168 and that the optical reflectors 152, 154, 156, 158, 160, 162, 164, 166, 168 are static. Stated differently, after halting the rotations of the optical reflectors 152, 154, 156, 158, 160, 162, 164, 166, 168, the EUV light 316 is generated while the optical reflectors 152, 154, 156, 158, 160, 162, 164, 166, 168 are static.

Afterward, the process 400 continues with the action S460 which is halting generating the laser beam and the droplets. For example, the controller 192 can be programmed to halt the laser emission operation and the droplet shooting operation, such that generating the laser beam and the droplets is halted and thus the generation of the EUV light is halted as well.

In the example configuration in FIG. 13, the controllers 190A-190I are programmed to halt the rotations of the optical reflectors 152, 154, 156, 158, 160, 162, 164, 166, 168 before halting the laser emission operation and the droplet shooting operation by the controller 192. In other embodiments, the controllers 190A-190I are programmed to halt the rotations of the optical reflectors 152, 154, 156, 158, 160, 162, 164, 166, 168 after halting the laser emission operation and the droplet shooting operation by the controller 192.

Figure 14:
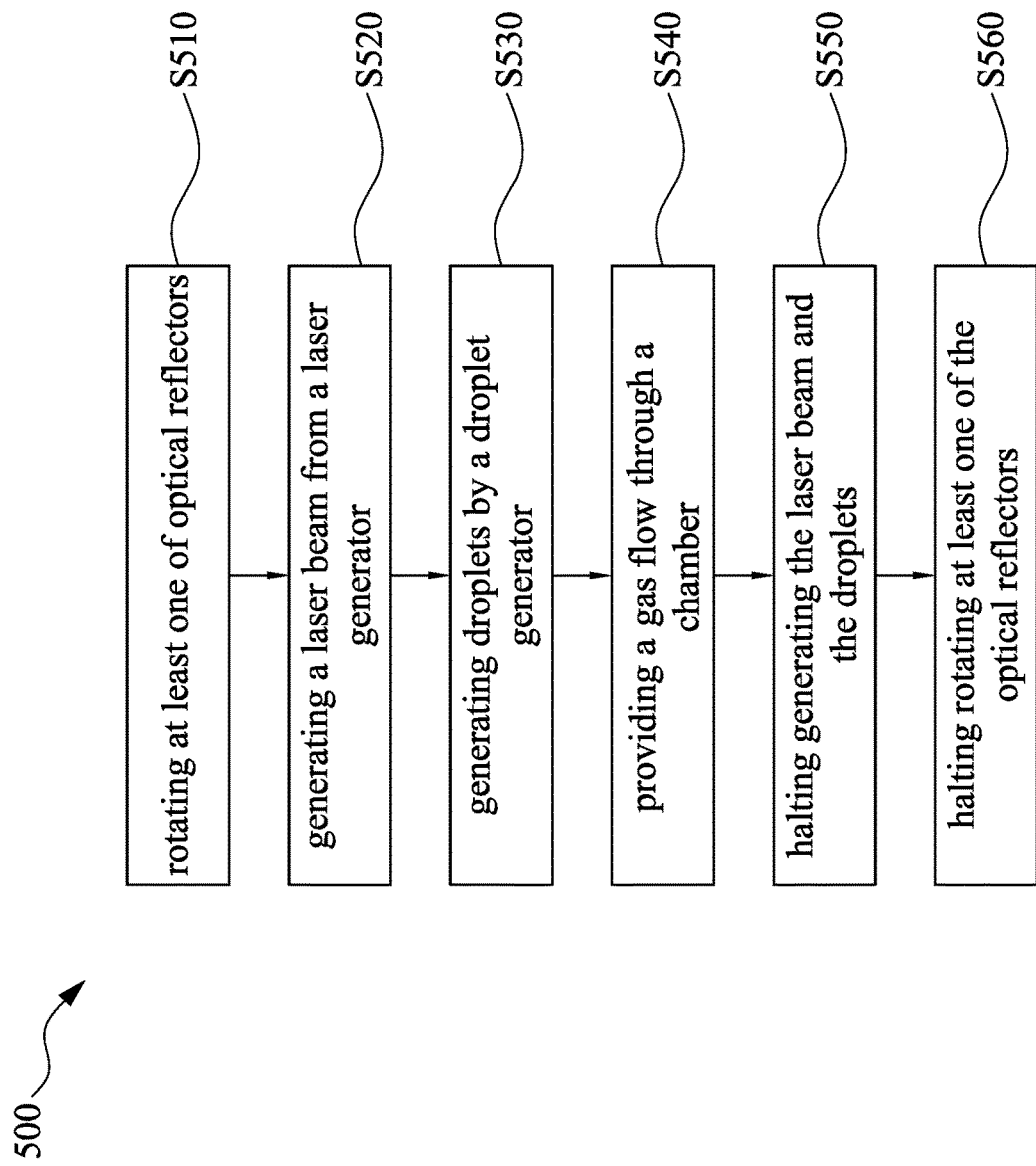
FIG. 14 is a flow chart of a process according to some embodiments of the present disclosure.
Figure 15:
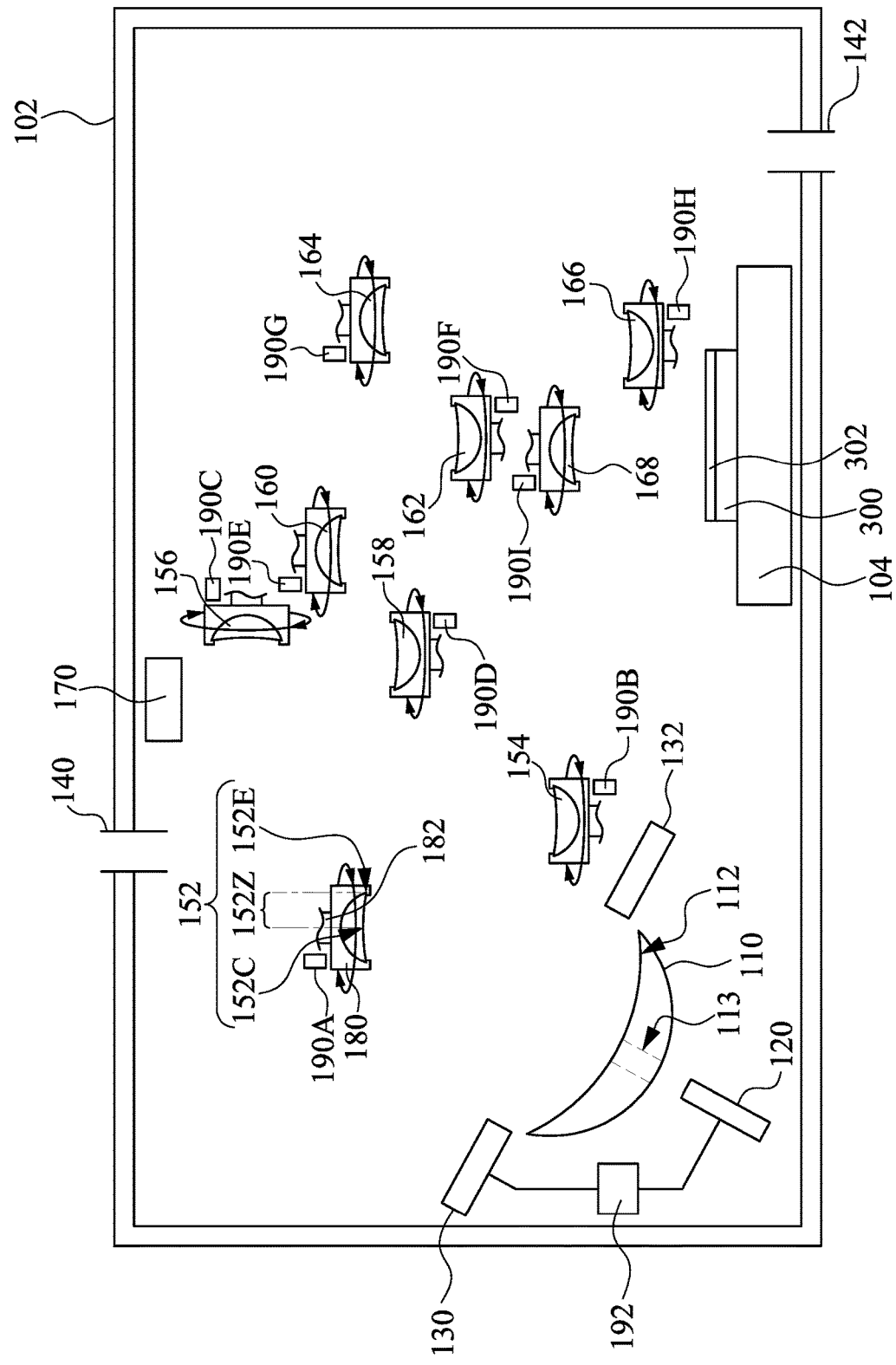
FIGS. 15-17 illustrate the lithography system of FIG. 1 with which the process of FIG. 14 is implemented according to some embodiments of the present disclosure.
Figure 16:
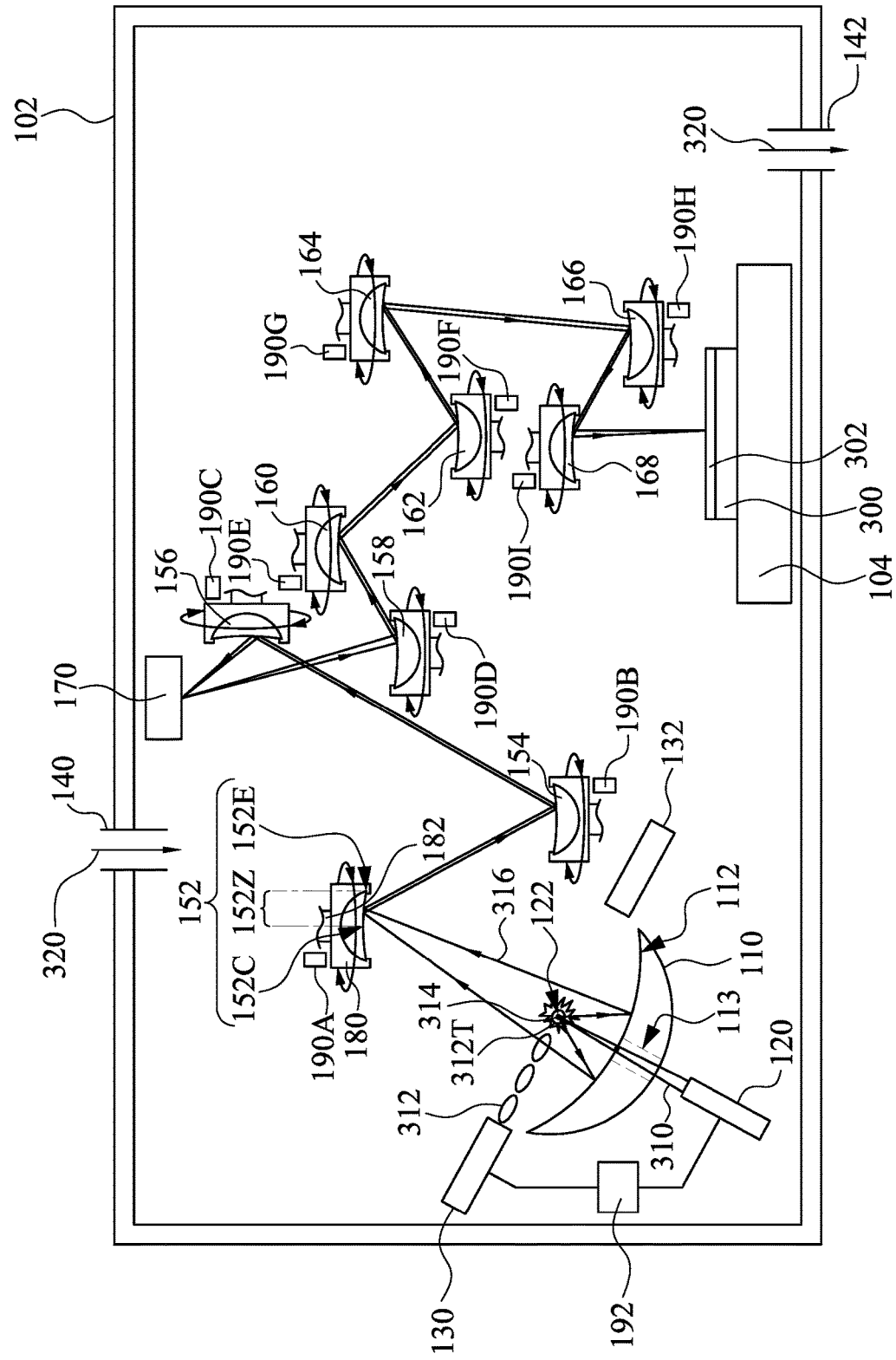
Figure 17:
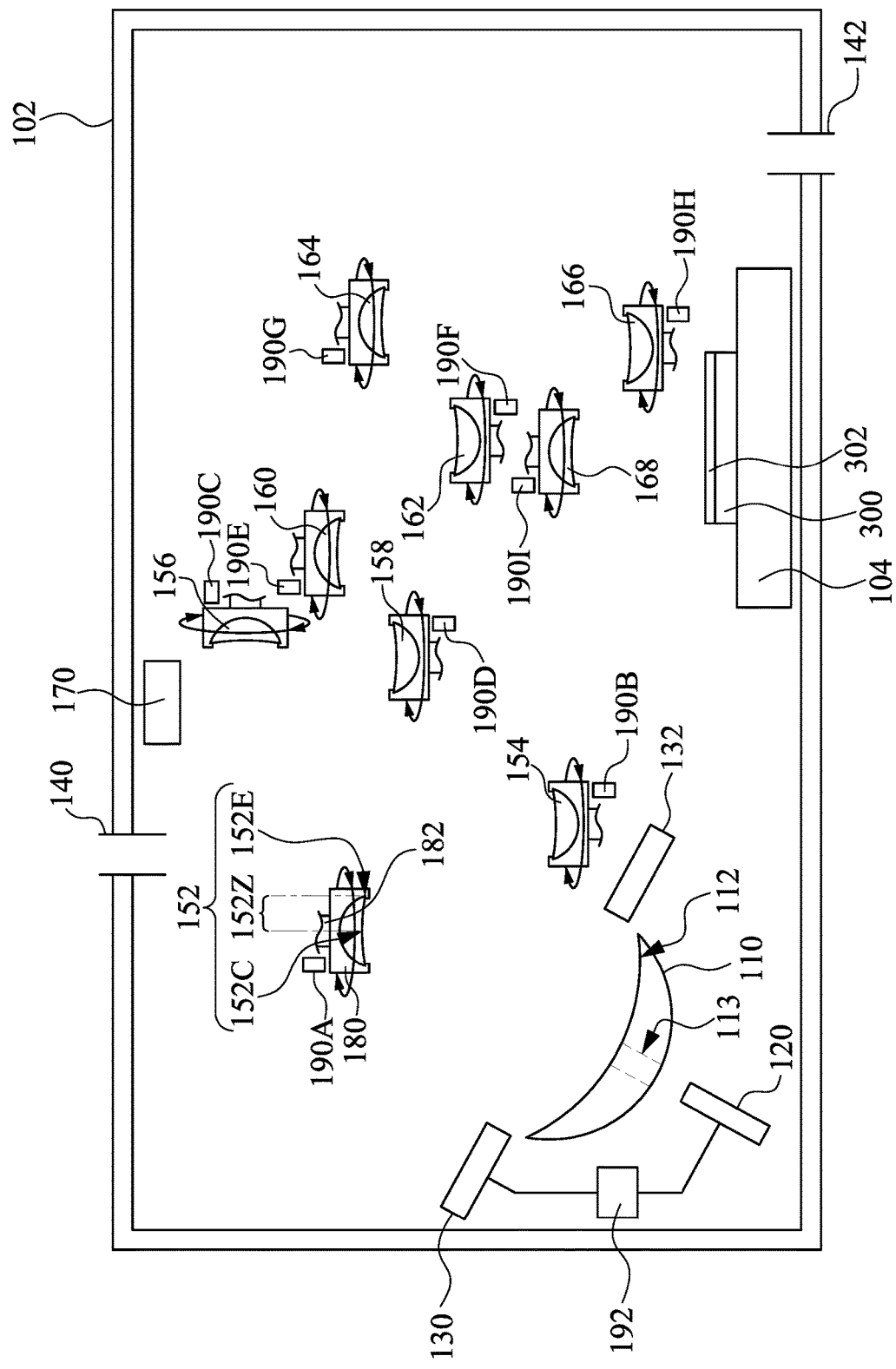

FIG. 14 is a flow chart of a process 500 according to some embodiments of the present disclosure. FIGS. 15-17 illustrate the lithography system 100 of FIG. 1 with which the process 500 of FIG. 14 is implemented according to some embodiments of the present disclosure. The process 500 includes actions S510, S520, S530, S540, S550, and S560. The lithography system 100 can be operated to expose a photoresist layer coated on a wafer by the process 500. For example, as shown in FIG. 15, the wafer 300 on which the photoresist layer 302 is coated is mounted on the stepper 104 within the chamber 102, and the lithography system 100 is operated to expose the photoresist layer 302 coated on the wafer 300.

Many aspects of the process 500 are the same as or similar to those of the process 200 as previously described in FIG. 4. For example, the action S520 is generating a laser beam from a laser generator, and many aspects of the action S520 are the same as or similar to those of the action S210 as previously described in FIG. 5. The action S530 is generating droplets by a droplet generator, and many aspects of the action S530 are the same as or similar to those of the action S220 as previously described in FIG. 5. The action S540 is providing a gas flow through a chamber, and many aspects of the action S540 are the same as or similar to those of the action S230 as previously described in FIG. 5. During the actions S520, S530, and S540, EUV light is generated as well. Because the actions S520, S530, and S540 can be performed as previously described in FIG. 5, and the detailed explanation may be omitted.

Different from the process 200, in the process 500, triggering a rotation of at least one of optical reflectors is performed before triggering the laser emission operation and the droplet shooting operation. Accordingly, prior to the actions S520, S530, and S540, the action S510 which is rotating at least one of optical reflectors is performed. For example, as shown in FIG. 15, the controllers 190A-190I can be programmed to trigger rotations of the optical reflectors 152, 154, 156, 158, 160, 162, 164, 166, 168.

Following the action S510, the actions S520, S530, and S540 are performed, such that EUV light 316 is generated to expose the photoresist layer 302 coated on the wafer 300, as shown in FIG. 16. during the actions S520, S530, and S540 (i.e., during the laser emission operation and the droplet shooting operation), the optical reflectors 152, 154, 156, 158, 160, 162, 164, 166, 168 are rotated while the EUV light 316 is generated. Explained in different ways, the optical reflectors 152, 154, 156, 158, 160, 162, 164, 166, 168 continuously rotate during an entire period of being incident with EUV light 316.

Thereafter, the process 500 continues with the actions S550 which is halting generating the laser beam and the droplets. For example, as shown in FIG. 17, before the controllers 190A-190I halt the rotations of the optical reflectors 152, 154, 156, 158, 160, 162, 164, 166, 168, the controllers 190A-190I and 192 can be programmed such that the controllers the controller 192 can halt the laser emission operation and the droplet shooting operation, so as to halt generating the laser beam and the droplets. Stated differently, after halting the laser emission operation and the droplet shooting operation, the optical reflectors 152, 154, 156, 158, 160, 162, 164, 166, 168 are rotated without reflecting EUV light.

Afterward, the process 500 continues with the action S560 which is halting rotating at least one of the optical reflectors. For example, the controllers 190A-190I can be programmed to halt the rotations of the optical reflectors 152, 154, 156, 158, 160, 162, 164, 166, 168, such that the optical reflectors 152, 154, 156, 158, 160, 162, 164, 166, 168 are static.

In the example configuration in FIG. 17, the controller 192 is programmed to halt the laser emission operation and the droplet shooting operation before halting the rotations of the optical reflectors 152, 154, 156, 158, 160, 162, 164, 166, 168. In other embodiments, the controller 192 is programmed to halt the laser emission operation and the droplet shooting operation after halting the rotations of the optical reflectors 152, 154, 156, 158, 160, 162, 164, 166, 168.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the optical reflectors can be driven to rotate by the corresponding motors, and thus different regions of each of the reflections surfaces of the optical reflectors can reflect EUV light in different exposing operations, which in turn will be advantageous for avoiding energy loss of the EUV light which is applied to a photoresist layer. Moreover, since the different regions of each of the reflections surfaces of the optical reflectors can reflect EUV light as time passes, it can prevent the EUV light from focusing on a specific region of each of the reflections surfaces of the optical reflectors, which in turn will reduce deterioration and contamination on the optical reflectors. Accordingly, throughput and yield of the EUV process can be improved. Another advantage is that triggering and halting the rotations of the optical reflector can be independent of triggering and halting the laser emission operation and the droplet shooting operation, which in turn will be advantageous for achieving a flexible process for exposing the wafer.

According to various embodiments of the present disclosure, a method is provided. The method includes steps as follows. EUV light is generated. A collector is used to gather the EUV light onto a first optical reflector. The first optical reflector is used to reflect the EUV light to a reticle, so as to impart the EUV light with a pattern. A second optical reflector is used to reflect the EUV light with the pattern onto a wafer. The first optical reflector is rotated.

According to various embodiments of the present disclosure, a method is provided. The method includes steps as follows. EUV light is generated in a chamber. A collector is used to gather the EUV light onto a first region of a first optical reflector. The first region of the first optical reflector is used to reflect the EUV light to a reticle to impart the EUV light with a pattern. A second optical reflector is used to reflect the EUV light with the pattern onto a wafer within the chamber. The first optical reflector is revolved, such that the EUV light is reflected by a second region of the first optical reflector, in which the first region of the first optical reflector is free from emitted by the EUV light when the EUV light is reflected by the second region of the first optical reflector.

According to various embodiments of the present disclosure, an lithography system includes a collector, a laser generator, a droplet generator, and a rotatable optical reflector. The collector has a mirror surface and an optical axis. The laser generator aims at a position in the optical axis and in front of the mirror surface. The droplet generator aims at the position. The rotatable optical reflector overlaps with the optical axis of the collector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   generating extreme ultraviolet (EUV) light, wherein generating the EUV light comprises:
   generating a laser beam aiming at a target from a laser generator; and
   shooting at least one droplet at the target from a droplet generator, such that the droplet is illuminated by the laser beam and the EUV light is generated;
   using a collector to gather the EUV light onto a first optical reflector;
   using the first optical reflector to reflect the EUV light to a reticle, so as to impart the EUV light with a pattern;

using a second optical reflector to reflect the EUV light with the pattern onto a wafer; and
rotating the first optical reflector;
halting rotating the first optical reflector; and
halting generating the laser beam and shooting the droplet after halting rotating the first optical reflector.

2. The method of claim 1, wherein rotating the first optical reflector is performed after generating the laser beam and shooting the droplet.

3. The method of claim 1, wherein generating the laser beam and shooting the droplet are performed after rotating the first optical reflector.

4. The method of claim 1, wherein generating the EUV light is performed during rotating the first optical reflector.

5. The method of claim 1, wherein using the first optical reflector to reflect the EUV light is performed during rotating the first optical reflector.

6. The method of claim 1, further comprising:
rotating the second optical reflector such that the second optical reflector rotates during rotating the first optical reflector.

7. A method comprising:
generating extreme ultraviolet (EUV) light in a chamber, wherein generating the EUV light comprises:
generating a laser beam aiming at a target from a laser generator; and
shooting at least one droplet at the target from a droplet generator, such that the droplet is illuminate by the laser beam and the EUV light is generated;
using a collector to gather the EUV light onto a first region of a first optical reflector;
using the first region of the first optical reflector to reflect the EUV light to a reticle to impart the EUV light with a pattern;
using a second optical reflector to reflect the EUV light with the pattern onto a wafer within the chamber;
revolving the first optical reflector, such that the EUV light is reflected by a second region of the first optical reflector, wherein the first region of the first optical reflector is free from incidence of the EUV light when the EUV light is reflected by the second region of the first optical reflector;
halting revolving the first optical reflector; and
halting generating the laser beam and shooting the droplet after revolving the first optical reflector.

8. The method of claim 7, wherein the EUV light is gathered to the first optical reflector at a position with respect to the chamber, and the position overlaps the first region prior to rotating the first optical reflector and overlaps the second region after rotating the first optical reflector.

9. The method of claim 7, wherein the first and second regions of the first optical reflector are located within a non-central zone of the first optical reflector.

10. The method of claim 7, wherein rotating the first optical reflector is performed during generating the laser beam and shooting the droplet.

11. The method of claim 7, wherein generating the laser and shooting the droplet are performed during rotating the first optical reflector.

12. The method of claim 7, further comprising:
revolving the second optical reflector, such that the first and second optical reflectors are rotated during generating the EUV light in the chamber.

13. A lithography system comprising:
a collector having a mirror surface and an optical axis;
a laser generator aiming at a position in the optical axis and in front of the mirror surface and configured to generate a laser beam;
a droplet generator aiming at the position and configured to shoot at least one droplet; and
a rotatable optical reflector overlapping with the optical axis of the collector, wherein the laser generator and droplet generator are configured to halt generating of the laser beam and shooting the droplet after halting rotation of the rotatable optical reflector.

14. The lithography system of claim 13, further comprising:
a holder holding the rotatable optical reflector;
a motor; and
a shaft connecting the motor and the holder.

15. The lithography system of claim 14, further comprising:
a roller mounted to the holder and configured to assist with the rotation of the rotatable optical reflector.

16. The lithography system of claim 14, further comprising:
a controller electrically connected to the motor, the laser generator, and the droplet generator and configured to drive rotation of the rotatable optical reflector and to trigger a laser emission of the laser generator and the droplet shooting operation of the droplet generator.

17. The lithography system of claim 14, further comprising:
a first controller electrically connected to the motor and configured to trigger rotation of the rotatable optical reflector; and
a second controller electrically connected to the laser generator and the droplet generator and configured to trigger laser emission of the laser generator and droplet shooting operation of the droplet generator.

18. The lithography system of claim 17, wherein the first controller is configured to trigger rotation of the rotatable optical reflector and the second controller is configured to trigger laser emission of the laser generator and droplet shooting operation of the droplet generator at the same time.

19. The lithography system of claim 17, wherein the first controller is configured to trigger rotation of the rotatable optical reflector after the second controller triggers laser emission of the laser generator and droplet shooting operation of the droplet generator.

20. The lithography system of claim 17, wherein the first controller is configured to trigger rotation of the rotatable optical reflector before the second controller triggers laser emission of the laser generator and droplet shooting operation of the droplet generator.

* * * * *